(12) United States Patent
Wu et al.

(10) Patent No.: US 7,007,746 B2
(45) Date of Patent: Mar. 7, 2006

(54) CIRCULATIVE COOLING APPARATUS

(75) Inventors: Wei-Fang Wu, Taiping (TW);
Yu-Hung Huang, Ilan (TW);
Chin-Ming Chen, Taoyuan (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 298 days.

(21) Appl. No.: 10/621,452

(22) Filed: Jul. 18, 2003

(65) Prior Publication Data
US 2004/0163796 A1   Aug. 26, 2004

(30) Foreign Application Priority Data
Feb. 20, 2003   (TW) .............................. 92202678 U

(51) Int. Cl.
*F28D 15/02* (2006.01)
(52) U.S. Cl. .......................... 165/104.26; 165/104.33; 361/700
(58) Field of Classification Search .......... 165/104.26, 165/104.33; 361/700
See application file for complete search history.

(56) References Cited

U.S. PATENT DOCUMENTS

| 3,543,839 | A | * | 12/1970 | Shlosinger | .................. | 165/274 |
|---|---|---|---|---|---|---|
| 3,762,011 | A | * | 10/1973 | Staudhammer et al. | ........ | 419/2 |
| 3,776,304 | A | * | 12/1973 | Auerbach | ..................... | 165/96 |
| 3,786,861 | A | * | 1/1974 | Eggers | ................... | 165/104.26 |
| 3,921,710 | A | * | 11/1975 | Katayama | .............. | 165/104.26 |
| 4,640,347 | A | * | 2/1987 | Grover et al. | ......... | 165/104.26 |
| 5,394,936 | A | * | 3/1995 | Budelman | .............. | 165/104.33 |
| 5,725,049 | A | * | 3/1998 | Swanson et al. | ....... | 165/104.26 |
| 5,764,483 | A | * | 6/1998 | Ohashi et al. | .............. | 361/699 |
| 5,884,693 | A | * | 3/1999 | Austin et al. | ........... | 165/104.33 |
| 6,840,310 | B1 | * | 1/2005 | Tonosaki et al. | ...... | 165/104.21 |
| 6,873,525 | B1 | * | 3/2005 | Minamitani et al. | ........ | 361/687 |
| 6,901,994 | B1 | * | 6/2005 | Jin-Cherng et al. | .... | 165/104.26 |
| 2002/0062648 | A1 | * | 5/2002 | Ghoshai | ....................... | 62/3.7 |
| 2003/0121645 | A1 | * | 7/2003 | Wang | .................... | 165/104.26 |

FOREIGN PATENT DOCUMENTS

DE         3301998 A1 *  7/1984

* cited by examiner

*Primary Examiner*—Allen J. Flanigan

(57) ABSTRACT

The circulative cooling apparatus has a first chamber, a second chamber, a first pipe, and a second pipe. There are porous structures on internal walls of the first chamber and the second pipe. There is work fluid in the second chamber and the porous structures. The work fluid is evaporated by heat in the first chamber, and owing to the pressure drop the vapor of the work fluid moves to the second chamber through the first pipe. Then the vapor of the work fluid condenses into the work fluid in the second chamber. Afterward the work fluid is transported back to the first chamber through the second pipe using the porous structures thereof, thus forming a circulative cooling apparatus.

16 Claims, 3 Drawing Sheets

CIRCULATIVE COOLING APPARATUS

BACKGROUND OF THE INVENTION

1. Field of Invention

The present invention relates to a heat dissipation device. More particularly, the present invention relates to a circulative cooling apparatus.

2. Description of Related Art

Electronic devices are developed to have smaller volume, lighter weight, and lower power consumption as science and technology makes tremendous progress. Energy utility rates of electronic devices are not completely utilized since a lot of energy is consumed as heat energy. The heat energy arises a temperature inside an electronic system. When the temperature inside the electronic system is higher than that can be tolerated by the electronic devices thereof, the physical characteristics of the electronic devices are changed by the high surrounding temperature and the electronic system becomes abnormal, generates errors, or is halted. Furthermore, the temperature inside the electronic system is raised and the breakdown rate of the electronic system is higher.

A main object of heat dissipation is to enhance reliability of a system. A temperature surrounding the electronic devices inside the system has a great effect on the reliability of the system. The temperature inside the system must be maintained at a lower degree to obtain a higher reliability of the system. Heat dissipation devices are therefore used to lower the temperature inside the system to an ideal operating temperature range for the electronic devices inside the system. Heat dissipation device design concerns an operating environment of the system, operating conditions, and allowed operating temperatures of the system. A structure of the system with good heat dissipation shapes or apparatus can dissipate heat outside the system and maintain a constant temperature therein to keep the system stable.

In conventional systems, heat dissipation of electronic devices usually uses fans driven by electric power to dissipate heat absorbed by heat sinks, so as to force airflows surrounding electronic devices to convect. But disadvantages of this method are large power consumption, noise and vibration that affects operations of electronic devices. Therefore, various apparatus have been developed to replace conventional fans/heat sinks combinations, such as a heat dissipation apparatus using phase changes of materials.

The heat transferring efficiency of two phase flow heat removal is higher than the heat transferring efficiency of single phase flow heat removal. A feature of the two phase flow heat removal is use of the latent heat between two phases of a work fluid to remove rapidly a great amount of heat energy. Some conventional apparatus, such as heat pipes and vapor chambers, utilizes this method. The following description explains them respectively.

FIG. 1 is a schematic view of a structure of a conventional heat pipe 100 and operating processes thereof. As shown in FIG. 1, the heat pipe 100 is a hollow container with low pressure therein. Materials, such as sintered metal, or feltmetal, are used to make a porous structure 114 on internal walls of a pipe case 112. The porous structure 114 is soaked in a work fluid. The work fluid can be water, mercury, Freon, sodium, potassium or silver, depending upon what working temperature is needed.

A side of the heat pipe 100 is an evaporation section 102. The evaporation section 102 contacts heat energy 126 of a heat source, and the work fluid within the evaporation section 102 is evaporated to become vapor because of absorbing heat energy 126 from the heat source. Owing to the pressure drop the vapor forms a vapor flow flowing to a condensation section 104, and then condenses into the original work fluid. The condensed work fluid falls to the porous structure 114 inside the condensation section 104, and afterward forms fluid flow 124 to flow back to evaporation section 102 due to capillary action. Evaporation and condensation are repeated to dissipate heat.

FIG. 2 is a schematic view of a structure of a conventional vapor chamber 200 and operating processes thereof. As shown in FIG. 2, the vapor chamber 200 is a hollow container with a low pressure therein. Internal walls of the vapor chamber 200 are like the heat pipe 100 as illustrated in FIG. 1, having a porous structure 214, and the porous structure 214 is also soaked in a work fluid. A side of the vapor chamber 200 is an evaporation section 202.

The evaporation section 202 contacts heat energy 226 of a heat source, and the work fluid within the evaporation section 202 is evaporated to become vapor by absorbing heat energy 226 from the heat source. The vapor moves upward and contacts an upper chamber wall 212 on the top of the evaporation section 202, and then dissipates heat therein and condenses back to the original work fluid. The condensed work fluid falls back to the evaporation section 202 due to gravity or other reasons. Evaporation and condensation are repeated to dissipate heat.

The method of two phase flow heat removal continuously removes heat energy from a heat source by a successive circulation of a work fluid. The work fluid absorbs and dissipates latent heat of phase change to transfer heat energy, and the thermal conductivity thereof is a hundred or thousands of times greater than that of the thermal conductivities of silver or copper. For example, a effective thermal conductivity of a simplest sodium heat pipe (using stainless steel as it's the pipe case, rolling stainless steel net as it's the porous structure, and sodium as it's the work fluid) is over 418 J/(cm·s·° C.), but a thermal conductivity of copper is only 3.8 J/(cm·s·° C.).

However, since the work fluid and the vapor thereof both exist in the same space, when the evaporation rate of the vapor and the condensation rate of the work fluid reach critical values, entrainment and counter current flow are generated. These increase the instability between the work fluid and the vapor, and further decrease the condensed work fluid that should flow back to the evaporation section for a next evaporation procedure. If the work fluid cannot flow back to the evaporation section successfully, the heat energy of the evaporation section does not dissipate by the circulative work fluid. Then the temperature of the evaporation is continuously raised until the pipe is dried out and disabled.

SUMMARY OF THE INVENTION

It is therefore an objective of the present invention to provide a circulative cooling apparatus that satisfies the need to improve the dry-out problem of conventional heat pipes and vapor chambers.

In accordance with the foregoing and other objectives of the present invention, a circulative apparatus is described. The circulative cooling apparatus includes two chambers and two pipes. An evaporation chamber receives heat energy from a heat source, and a porous structure thereof contains saturated work fluid. The work fluid is evaporated to vapor by heat energy, and owing to the pressure drop the vapor of the work fluid moves to a condensation chamber through a vapor pipe. Then the vapor of the work fluid condenses into the work fluid because of the lower temperature of the condensation chamber. The condensation chamber is storage for the work fluid, and the work fluid is transported back to the evaporation chamber through a fluid pipe, thus forming a circulative cooling apparatus.

In one preferred embodiments of the present inventions, a gas channel is located inside the evaporation chamber that forces the vapor of the work fluid to flow according to a direction of the gas channel. Besides the direction for vapor flow, the gas channel also enlarges the unit air pressure inside the evaporation chamber to improve the vapor flow efficiency, so as to enhance the heat dissipation efficiency of the invention.

Furthermore, the work fluid stored in the condensation chamber is a buffer for the method of two phases flow removing heat, and prevents the apparatus from drying out. In addition, in this preferred embodiment, a position of the condensation chamber is lower than a position of the evaporation chamber, and gravity thus does not slow the capillary attraction of the porous structure, thus preserving the efficiency of the invention.

In another preferred embodiments of the present inventions, two dissipation devices, such as dissipation fins or dissipation fans, are installed on the evaporation chamber and the condensation chamber, so as to facilitate heat dissipation thereby.

The invention works on the principle of two phase flow heat removal; the thermal conductivity thereof is superior, heat response thereof is fast, and the heat transferring efficiency thereof is high. Furthermore, the invention uses the condensation chamber as storage for the work fluid, so the work fluid stored therein is a buffer to prevent the conventional drying out problem due to cooling too slowly. The operation lifetime of the invention is thereby extended. The invention also balances temperature of the chambers to decrease the spreading resistance effect.

The invention is a self-circulating cooling apparatus, and operates on its own without any additional power. Besides saving power, the invention also avoids the electronic elements attached thereto from overheating and then being burned due to the power devices or power transmission devices malfunctioning. The invention is not limited by the inner space of the system, and therefore can configure the invention according to the practical system design. Furthermore, the two chambers of the invention can be separated by a distance, so that the condensation chamber is distant from the heat source, thus enhancing the condensation efficiency of the work fluid and improving the heat dissipation efficiency of the invention.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
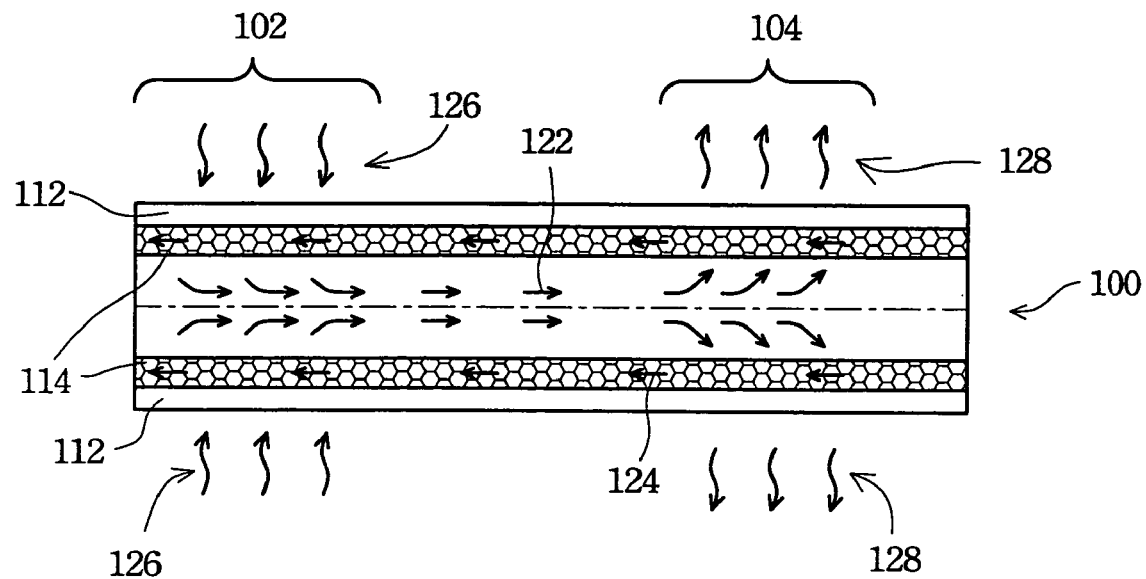
FIG. 1 is a schematic view of a structure of a conventional heat pipe and operating processes thereof.
Figure 2:
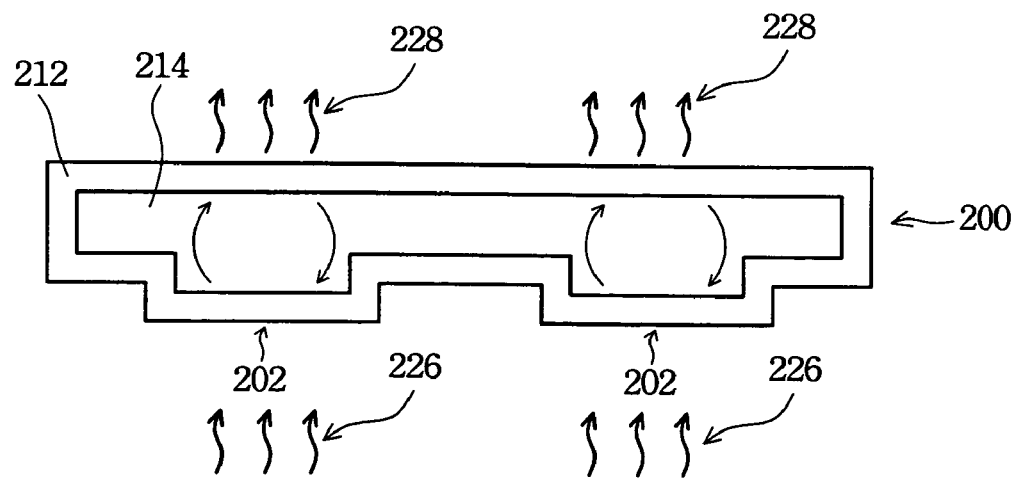
FIG. 2 is a schematic view of a structure of a conventional vapor chamber and operating processes thereof.

Reference will now be made in detail to the present preferred embodiments of the invention, examples of which are illustrated in the accompanying drawings. Wherever possible, the same reference numbers are used in the drawings and the description to refer to the same or like parts.

The present invention provides a circulative cooling apparatus to improve the dry-out problem of conventional heat pipes and vapor chambers.

The invention provides a circulative cooling apparatus including two chambers and two pipes. An evaporation chamber receives heat energy from a heat source, and a porous structure thereof contains saturated work fluid. The work fluid is evaporated to vapor by heat energy, and owing to the pressure drop the vapor of the work fluid moves to a condensation chamber through a vapor pipe. Then the vapor of the work fluid condenses into the work fluid because of the lower temperature of the condensation chamber. The condensation chamber is storage for the work fluid, and the work fluid is transported back to the evaporation chamber through a fluid pipe, thus forming a circulative cooling apparatus.

The condensation chamber contains a lot of work fluid, and the porous structure inside the evaporation chamber contains saturated work fluid. When the work fluid inside the evaporation chamber is evaporated to vapor by heat energy and then moves to the condensation chamber, the porous structure inside the evaporation chamber becomes unsaturated. At this time the work fluid stored inside the condensation chamber moves back to the evaporation chamber by capillary attraction of the porous structure until the porous structure of the evaporation chamber becomes saturated again.

A gas channel is located inside the evaporation chamber and forces the vapor of the work fluid to flow according a direction of the gas channel. Besides the direction for flowing the vapor, the gas channel also enlarges the unit air pressure inside the evaporation chamber to improve the vapor flowing efficiency, so as to enhance the heat dissipation efficiency of the invention. Furthermore, the work fluid stored in the condensation chamber is a buffer for the method of two phases flow removing heat, and prevents the apparatus from drying out and prolongs the operating lifetime thereof.

Figure 3:
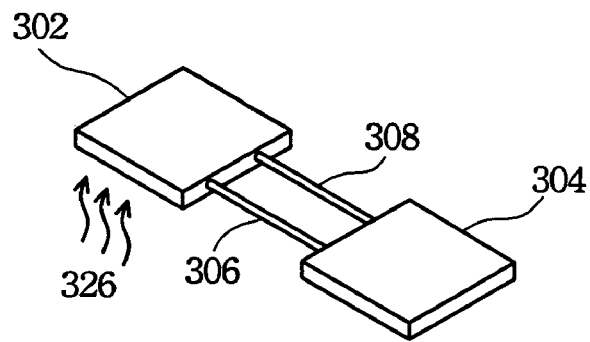
FIG. 3A illustrates a schematic view of one preferred embodiment of the invention.
FIG. 3B is a top view of an internal structure of the preferred embodiment in FIG. 3A.
FIG. 3C is a side view of the preferred embodiment in FIG. 3A.
Figure 3:
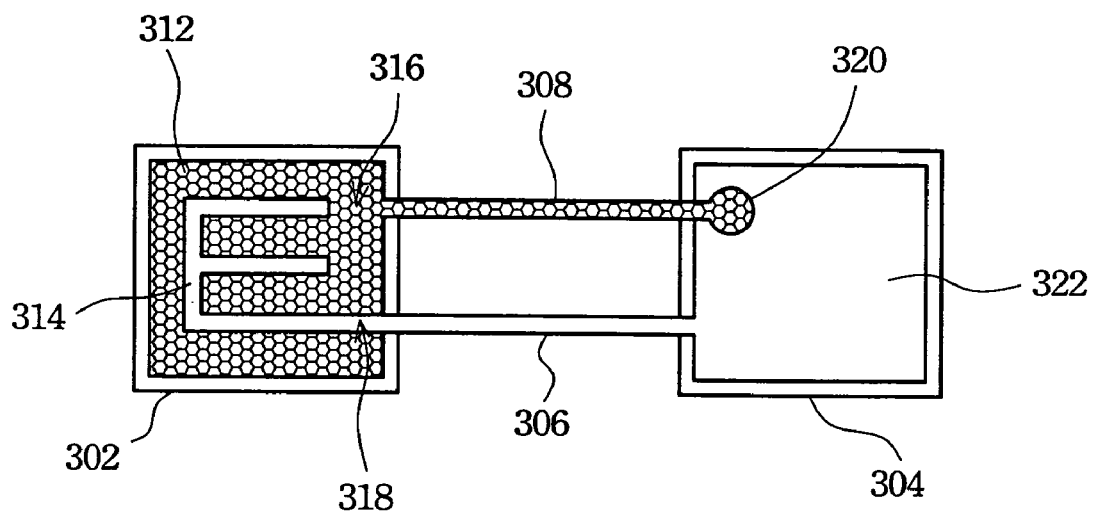
Figure 3:
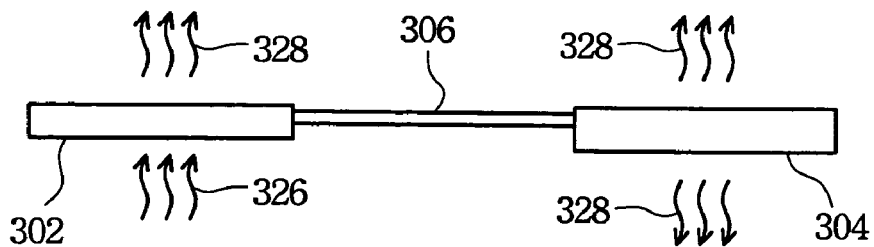

FIG. 3A illustrates a schematic view of one preferred embodiment of the invention. As shown in FIG. 3A, an evaporation chamber 302 is connected to a condensation chamber 304 by a vapor pipe 306 and a fluid pipe 308. A heat source is located below the evaporation chamber 302 to provide heat energy 326 to the evaporation chamber 302. The evaporation chamber 302, the condensation chamber 304, the vapor pipe 306 and the fluid pipe 308 can be integrally or separately formed.

FIG. 3B is a top view of an internal structure of the preferred embodiment in FIG. 3A. As shown in FIG. 3B, internal walls of the evaporation chamber 302 have a porous structure 312, and the porous structure 312 is made from sintered metal, or feltmetal. The porous structure 312 contains saturated work fluid. A gas channel 314 lacking the porous structure 312 is located inside the evaporation chamber 302, and the vapor inside the evaporation chamber 302 flows from the gas channel to the condensation chamber 304 through the vapor pipe 306.

In this preferred embodiment, the gas channel 314 is E-shaped, mainly to make the gas channel 314 spread everywhere inside the evaporation chamber 302. However, the shape of the gas channel 314 can be any other shape that spreads everywhere inside the evaporation chamber 302 to collect the vapor of the work fluid everywhere inside the evaporation chamber 302. Moreover, a volume of the gas channel is designed to be less than a volume of the vapor of the work fluid contained by the porous structure 312 inside the evaporation chamber 302. Thus, a unit air pressure of the gas channel 314 is enlarged to improve the efficiency of the vapor flowing from the evaporation chamber 302 to the condensation chamber 304, so as to enhance the heat dissipation efficiency of the invention.

The work fluid 322 fills the condensation chamber 304. A drawing area 320 is located inside the condensation chamber 304, and the drawing area 320 is connected to fluid pipe 308. The drawing area 320 and the fluid pipe 308 both have the porous structure inside. After the evaporation chamber 302 receiving the heat energy 326 of the heat source (as illustrated in FIG. 3A), the work fluid contained by the porous structure 312 of the evaporation chamber 302 is evaporated to vapor by heat energy and then flows according the direction of the gas channel 314. An end 316 of the gas channel 314 which is near the fluid pipe 308 is closed by the porous structure 312, and another end 318 of the gas channel 314 which is near the vapor pipe 306 is connected to the vapor pipe 306 to limit the flow direction of the vapor in the gas channel 314. Owing to the pressure drop between the two chambers 302 and 304, the vapor moves from the evaporation chamber 302 to the condensation chamber 304 through a vapor pipe 306, and then is condensed to the work fluid because of the lower temperature.

A condensed chamber 304 serves as storage for the work fluid 322, which stores a lot of work fluid 322, and the porous structure 312 inside the evaporation chamber 302 contains the saturated work fluid. When the work fluid inside the evaporation chamber 302 is evaporated to vapor by heat energy and then moves to the condensation chamber 304, the porous structure 312 inside the evaporation chamber 302 becomes unsaturated. At this time the work fluid stored inside the condensation chamber 304 moves back to the evaporation chamber 302 by a capillary attraction of the porous structure 312 until the porous structure 312 of the evaporation chamber 302 becomes saturated again.

FIG. 3C is a side view of the preferred embodiment in FIG. 3A. As shown in FIG. 3C, the evaporation chamber 302 receives the heat energy 326 of the heat source (not illustrated in FIG. 3C). After the work fluid inside evaporates into vapor, the vapor not only is condensed on the upper section of the evaporation chamber 302 to dissipate heat energy 328, but also moves to the condensation chamber 304 through the vapor pipe 306 and dissipates heat energy 328 by the condensation chamber 304. In addition, in this preferred embodiment, a position of the condensation chamber 304 is lower than a position of the evaporation chamber 302, and gravity thus does not slow the capillary attraction of the porous structure 312, so as to maintain the work efficiency of the invention.

Figure 4:
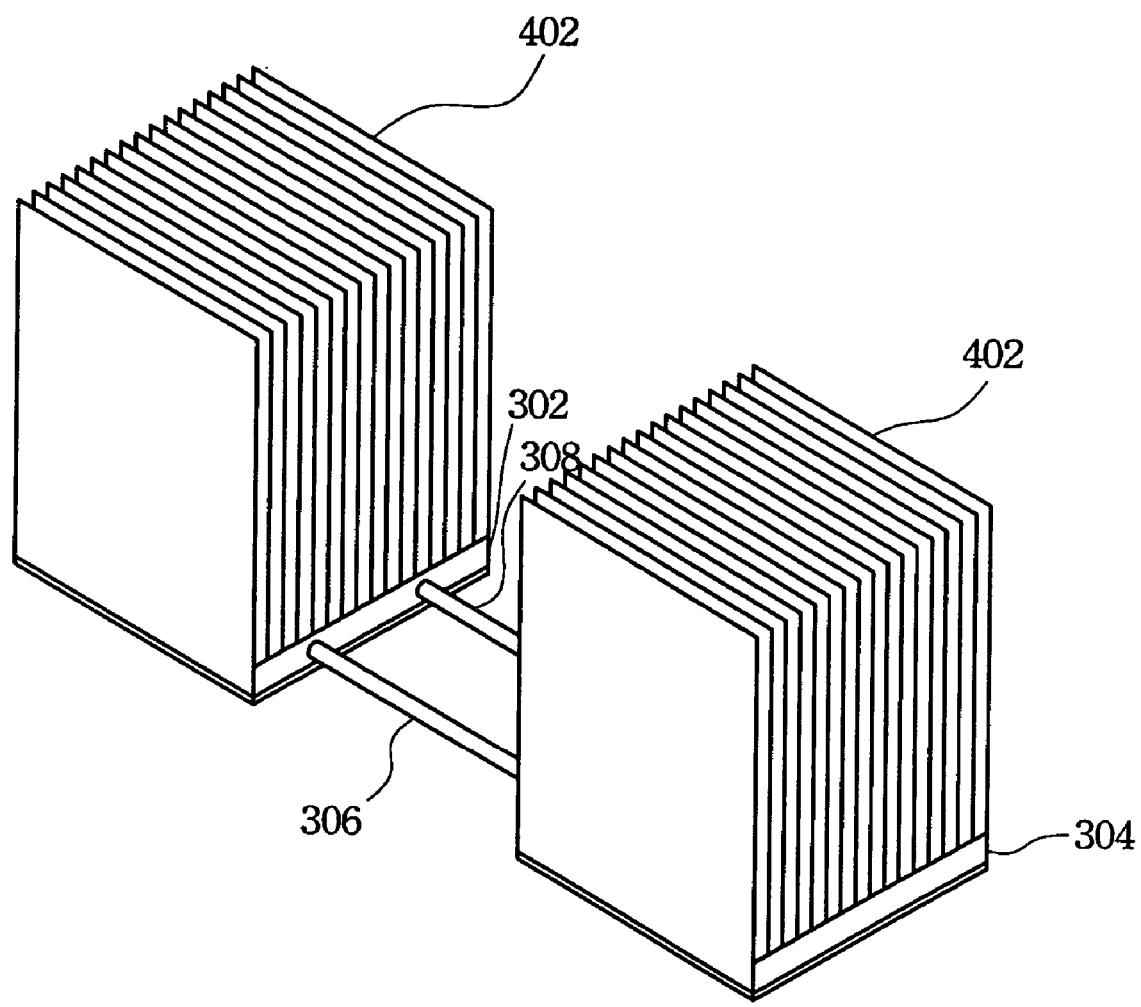
FIG. 4 is a schematic view of another preferred embodiment of the invention.

FIG. 4 is a schematic view of another preferred embodiment of the invention. Two dissipation devices 402, such as dissipation fins or dissipation fans, are installed on the preferred embodiment in FIG. 3 to facilitate the evaporation chamber 302 and condensation chamber 304 to dissipate heat. Thus enhances the heat dissipation efficiency of the invention, prolongs the operating lifetime of it, and avoids the invention drying out.

In conclusion, the invention has following advantages:

1. The invention works on the principle of two phase flow heat removal, and the thermal conductivity of it is superior, heat response of it is fast, and the heat transferring efficiency of it is high. Furthermore, the invention uses the condensation chamber as storage for the work fluid, so the work fluid stored therein is a buffer to avoid the conventional drying out problem due to cooling too slowly, and thus prolongs the operating lifetime of the invention. The invention also balances temperature of the chambers to decrease the spreading resistance effect.

2. The shape of the invention is simple and easy to manufacture, thus improves the yield thereof. Further, the internal structure of the invention is simple, without any complicated elements therein, so the breakdown rate thereof is lower. The invention is a self-circulating cooling apparatus, and operates on its own without any additional power. Besides saving power, the invention can prevent the electronic elements attached thereto from overheating then being burned due to the power devices or power transmission devices malfunctioning.

3. Conventional solid heat transferring efficiency is generally inversely proportional to the length of the transferring path. In other words, when the transferring path is longer, the solid heat transferring efficiency is lower. However, the invention does not have the foregoing disadvantages of the solid heat transferring, and is not limited by the length of the transferring path. Moreover, the invention also is not limited by the system inner space, and the invention can therefore be configured according to the practical system design. Furthermore, the two chambers of the invention can be separated by a distance, so the condensation chamber is distant from the heat source, thus enhancing the condensation efficiency of the work fluid and improving the heat dissipation efficiency of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circulative cooling apparatus, comprising:
   a first chamber for absorbing heat energy of a heat source, wherein the first chamber has a gas channel;
   a second chamber for dissipating the heat energy, the second chamber being filled with a fluid;
   a first pipe connecting the first chamber and the second chamber, wherein fluid vapor flows through the first pipe;
   a second pipe connecting the first chamber and the second chamber;
   a drawing area situated in the second chamber and connected to an end of the second pipe; and
   a porous structure on internal walls of the first chamber, the second pipe and the drawing area, the porous structure having the fluid inside;
   wherein the fluid is transported from the drawing area in the second chamber to the first chamber through the second pipe by a capillary attraction of the porous structure, and the gas channel is spread inside the first chamber to collect the vapor of the fluid.

2. The circulative cooling apparatus of claim 1, wherein the first chamber, the second chamber, the first pipe and the second pipe are integrally formed.

3. The circulative cooling apparatus of claim 1, wherein the channel is connected to an end of the first pipe and limits a flowing direction of the vapor of the fluid.

4. The circulative cooling apparatus of claim 3, wherein a volume of the gas channel is less than a volume of the vapor of the fluid in the porous structure of the first chamber.

5. The circulative cooling apparatus of claim 1, wherein a horizontal position of the second chamber is lower than a horizontal position of the first chamber, so that gravity thus does not slow the capillary attraction of the porous structure.

6. The circulative cooling apparatus of claim 1, wherein the drawing area contacts the fluid in the second chamber.

7. The circulative cooling apparatus of claim 1, wherein a material of the porous structure comprises metal.

8. The circulative cooling apparatus of claim 1, wherein the circulative cooling apparatus further comprises a plurality of heat dissipation devices installed on the first chamber and the second chamber.

9. The circulative cooling apparatus of claim 8, wherein the heat dissipation devices comprise dissipation fins or dissipation fans.

10. A circulative cooling apparatus, comprising:
   first chamber for absorbing heat energy of a heat source;
   a second chamber for dissipating the heat energy, the second chamber being filled with a fluid;
   a first pipe connecting the first chamber and the second chamber, wherein vapor of the fluid flows through the first pipe;
   a second pipe connecting the first chamber and the second chamber;
   a drawing area situated in the second chamber and connected to an end of the second pipe, wherein the drawing area contacts the fluid in the second chamber;
   a gas channel, wherein the gas channel is connected to an end of the first pipe and limits a flowing direction of the vapor of the fluid; and
   a porous structure on internal walls of the first chamber, the second pipe and the drawing area, and the porous structure having the fluid inside;
   wherein the fluid is transported from the drawing area in the second chamber to the first chamber through the second pipe by a capillary attraction of the porous structure, and the gas channel is spread inside the first chamber to collect the vapor of the fluid.

11. The circulative cooling apparatus of claim 10, wherein the first chamber, the second chamber, the first pipe and the second pipe are integrally formed.

12. The circulative cooling apparatus of claim 10, wherein a volume of the gas channel is less than a volume of the vapor of the fluid in the porous structure of the first chamber.

13. The circulative cooling apparatus of claim 10, wherein a horizontal position of the second chamber is lower than a horizontal position of the first chamber, so that gravity thus does not slow the capillary attraction of the porous structure.

14. The circulative cooling apparatus of claim 10, wherein a material of the porous structure comprises metal.

15. The circulative cooling apparatus of claim 10, wherein the circulative cooling apparatus further comprises a plurality of heat dissipation devices installed on the first chamber and the second chamber.

16. The circulative cooling apparatus of claim 15, wherein the heat dissipation devices comprise dissipation fins or dissipation fans.

* * * * *